US008305116B2

(12) United States Patent
Jang et al.

(10) Patent No.: US 8,305,116 B2
(45) Date of Patent: Nov. 6, 2012

(54) INJECTION-LOCKED FREQUENCY DIVIDING APPARATUS

(75) Inventors: Sheng-Lyang Jang, Taipei (TW); Yu-Sheng Chen, Yunlin County (TW); Chia-Wei Chang, Taipei (TW); Cheng-Chen Liu, Taipei County (TW)

(73) Assignee: National Taiwan University of Science and Technology, Taipei (TW)

( * ) Notice: Subject to any disclaimer, the term of this patent is extended or adjusted under 35 U.S.C. 154(b) by 67 days.

(21) Appl. No.: 13/014,692

(22) Filed: Jan. 26, 2011

(65) Prior Publication Data

US 2012/0062287 A1 Mar. 15, 2012

(30) Foreign Application Priority Data

Sep. 15, 2010 (TW) .................................. 99131227 A

(51) Int. Cl.
*H03K 21/00* (2006.01)
(52) U.S. Cl. ........................................ 327/115; 327/117
(58) Field of Classification Search ..................... 327/48, 327/115, 117, 118; 377/47, 48
See application file for complete search history.

(56) References Cited

U.S. PATENT DOCUMENTS

| 7,522,007 | B2 | 4/2009 | Jang et al. | |
|---|---|---|---|---|
| 7,557,664 | B1 * | 7/2009 | Wu | 331/51 |
| 7,557,668 | B2 * | 7/2009 | Jang et al. | 331/167 |
| 7,656,205 | B2 * | 2/2010 | Chen et al. | 327/115 |
| 7,671,640 | B2 * | 3/2010 | Lee et al. | 327/115 |

OTHER PUBLICATIONS

Sheng-Lyang Jang et al., "A Wide-Locking Range divided by 3 Injection-Locked Frequency Divider Using Linear Mixer", appears in: Microwave and Wireless Components Letters, IEEE. Issued on Jul. 2010, p. 390-p. 392.
Sheng-Lyang Jang et al., "A 90 nm CMOS LC-Tank Divide-by-3 Injection-Locked Frequency Divider With Record Locking Range", appears in Microwave and Wireless Components Letters, IEEE. Issued on Apr. 2010, p. 229-p. 231.

* cited by examiner

*Primary Examiner* — Hai L Nguyen
(74) *Attorney, Agent, or Firm* — Jianq Chyun IP Office

(57) ABSTRACT

An injection-locked frequency dividing apparatus including a frequency multiplier, a first linear mixer, a second linear mixer, and an oscillator is disclosed. The frequency multiplier receives a frequency signal and generates a multiple-frequency signal accordingly. The first and the second linear mixer both receive the multiple-frequency signal and respectively receive a first input signal and a second input signal, wherein the phases of the first and the second input signal are complementary. The first and the second linear mixer respectively mix the multiple-frequency signal with the first and the second input signal to respectively generate a first mixed signal and a second mixed signal. The oscillator generates the frequency signal. The oscillator further receives the first and the second mixed signal and generates a first output signal and a second output signal accordingly, wherein the phases of the first and the second output signal are complementary.

17 Claims, 5 Drawing Sheets

US 8,305,116 B2

INJECTION-LOCKED FREQUENCY DIVIDING APPARATUS

CROSS-REFERENCE TO RELATED APPLICATION

This application claims the priority benefit of Taiwan application serial no. 99131227, filed on Sep. 15, 2010. The entirety of the above-mentioned patent application is hereby incorporated by reference herein and made a part of this specification.

BACKGROUND OF THE INVENTION

1. Field of the Invention

The present invention generally relates to an injection-locked frequency dividing apparatus, and more particularly, to an injection-locked frequency dividing apparatus with linear mixers.

2. Description of Related Art

Along with the rapid development of communication technologies, the quantity and speed for transmitting data over communication networks have been drastically increased, and broad transmission bands have always been adopted in order to increase the transmission rate. In the wireless communication field, highly integrated and low-cost complementary metal-oxide-semiconductor (CMOS) chips are desired. While in a transceiver of a communication system, a frequency synthesizer is usually adopted for supplying a stable local oscillation signal. Besides, frequency divider is one of the major elements in a frequency synthesizer, and the operation frequency range thereof has to cover the frequency band of the frequency synthesizer.

An injection-locked frequency divider with a wide lock range can be used for designing a broadband frequency synthesizer and eventually applied to a system conforming to different communication protocols, such as IEEE 802.11b/g, 802.16d, and ultra wide band. Thus, an injection-locked frequency divider should be designed to have a wider lock range.

An injection-locked oscillator is usually implemented by using a cross-coupled oscillator as the major element for generating the oscillation signal. When signals having the same phase are injected into such a device with a differential output structure, because the even harmonics of the circuit also have the same phase, they are synchronous to the input signals. Thus, the circuit may have an even divisor when signals having the same phase are input. While designing a divide-by-3 injection-locked frequency divider, the injection-locked effect when signals having the same phase are input is not very ideal for the lock range is very narrow. Thus, a differential input structure has to be adopted.

In a conventional divide-by-3 injection-locked frequency divider, two serial or parallel input transistors are disposed for injecting differential signals from both sides of the circuit, and the injection transistors are served as nonlinear transistor mixers. The nonlinear operations of the transistors generate different harmonic factors in the output, and the nonlinear transistor mixers generate different harmonic and sub-harmonic factors. When an input signal of the divide-by-3 injection-locked frequency divider is mixed to have one third of the input frequency, the core oscillator can be injection-locked. However, the mixed result produced by foregoing circuit is very complicated. Because the power is distributed over a broad frequency domain and there is only a small amount of valid sub-harmonic power, the lock range of the frequency divider is limited and accordingly the application of the frequency divider is affected.

SUMMARY OF THE INVENTION

Accordingly, the present invention is directed to an injection-locked frequency dividing apparatus for eliminating nonlinear harmonic factors.

The present invention provides an injection-locked frequency dividing apparatus including a frequency multiplier, a first linear mixer, a second linear mixer, and an oscillator. The frequency multiplier receives a frequency signal and generates a multiple-frequency signal according to the frequency signal. The first linear mixer and the second linear mixer are both coupled to the frequency multiplier and both receive the multiple-frequency signal. The first linear mixer and the second linear mixer further respectively receive a first input signal and a second input signal and respectively mix the multiple-frequency signal with the first input signal and the second input signal to generate a first mixed signal and a second mixed signal respectively, wherein the phase of the first input signal is complementary to the phase of the second input signal. The oscillator is coupled to the first linear mixer, the second linear mixer, and the frequency multiplier and generates the frequency signal. The oscillator further receives the first mixed signal and the second mixed signal and generates a first output signal and a second output signal according to the first mixed signal and the second mixed signal, wherein the phase of the first output signal is complementary to the phase of the second output signal.

As described above, in the present invention, harmonic factors generated by nonlinear circuits are eliminated by using linear mixers to increase the injection-locked portion in the frequency, so that the oscillation frequency can be easily locked, and the lock range thereof can be extended. Accordingly, the overall performance of the frequency dividing apparatus is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
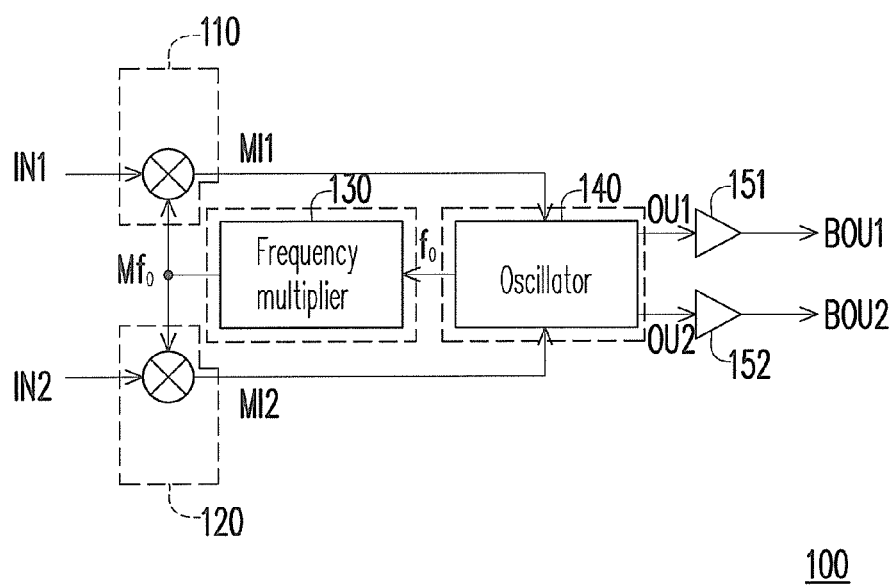
FIG. 1 is a diagram of an injection-locked frequency dividing apparatus 100 according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of an injection-locked frequency dividing apparatus 100 according to an embodiment of the present invention. Referring to FIG. 1, the injection-locked frequency dividing apparatus 100 includes linear mixers 110 and 120, a frequency multiplier 130, an oscillator 140, and output buffers 151 and 152. The frequency multiplier 130 receives a frequency signal $f_o$ and generates a multiple-frequency signal $Mf_o$ according to the frequency signal $f_o$. In the present embodiment, the frequency of the multiple-frequency signal $Mf_o$ is twice the frequency of the frequency signal $f_o$.

The linear mixers 110 and 120 are both coupled to the frequency multiplier 130 and both receive the multiple-frequency signal $Mf_o$. Besides, the linear mixer 110 receives an input signal IN1, and the linear mixer 120 receives an input signal IN2, wherein the phases of the input signal IN1 and the input signal IN2 are complementary to each other (i.e., the phase difference between the input signal IN1 and the input signal IN2 is 180°). The linear mixer 110 mixes the multiple-frequency signal $Mf_o$ with the input signal IN1 and generates a mixed signal MI1, wherein the frequency of the mixed signal MI1 is equal to the frequency $f_i$ of the input signal IN1 minus twice the frequency of the frequency signal $f_o$ (i.e., $f_i$-2$f_o$). Similarly, the linear mixer 120 mixes the multiple-frequency signal $Mf_o$ with the input signal IN2 and generates a mixed signal MI2, wherein the frequency of the mixed signal MI2 is equal to the frequency $f_i$ of the input signal IN1 minus twice the frequency of the frequency signal $f_o$ (i.e., $f_i$-2$f_o$).

The oscillator 140 is coupled to the linear mixers 110 and 120 and the frequency multiplier 130. The oscillator 140 generates the frequency signal $f_o$. Besides, the oscillator 140 further receives the mixed signals MI1 and MI2 and generates output signals OU1 and OU2 according to the mixed signals MI1 and MI2, wherein the phases of the output signals OU1 and OU2 are complementary to each other (i.e., the phase difference between the output signal OU1 and the output signal OU2 is 180°). In the present embodiment, the oscillator 140 is implemented as a cross-coupled voltage-controlled oscillator (VCO) for generating the frequency signal $f_o$ required by the injection-locked frequency dividing apparatus 100. By adopting a VCO, the oscillation frequency of the frequency signal $f_o$ can be adjusted according to the voltage. When the oscillation frequency of the frequency signal $f_o$ is adjusted by changing capacitances of variable capacitors in the VCO, the lock range shifts accordingly. Thereby, the range of the operation frequency is extended.

The output buffers 151 and 152 are respectively coupled to the oscillator 140 and respectively receive the output signals OU1 and OU2 to generate a buffered output signal BOU1 and a buffered output signal BOU2. The output buffers 151 and 152 are disposed to provide an impedance transformation medium between the injection-locked frequency dividing apparatus 100 and external circuits and to supply power for driving the next-level circuit connected to the injection-locked frequency dividing apparatus 100. Besides, the disposition of the output buffers 151 and 152 prevents the external circuits from becoming internal load of the injection-locked frequency dividing apparatus 100.

Below, different implementations of the injection-locked frequency dividing apparatus 100 provided by the present invention will be described in detail with reference to different embodiments so that those having ordinary knowledge in the art can implement the present invention accordingly.

Figure 2:
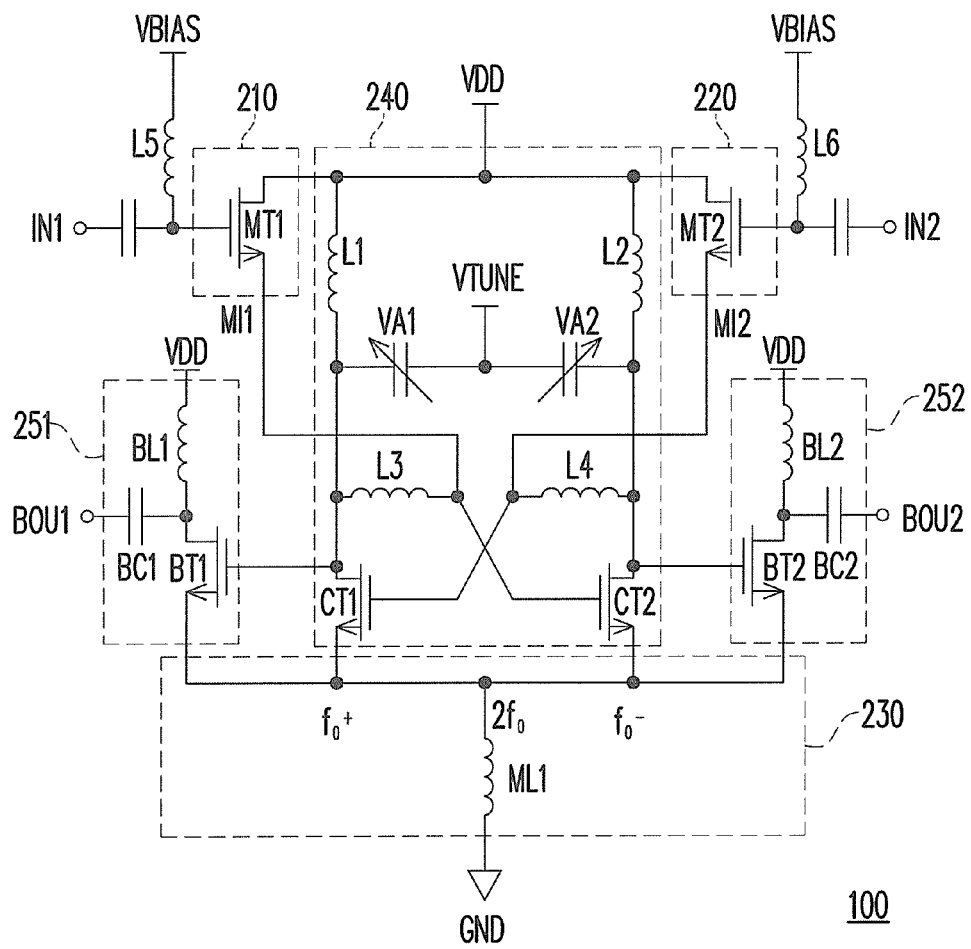
FIGS. 2-5 respectively illustrate different implementations of the injection-locked frequency dividing apparatus 100 according to embodiments of the present invention.

FIG. 2 illustrates an implementation of the injection-locked frequency dividing apparatus 100 according to an embodiment of the present invention. Referring to FIG. 2, in the present embodiment, the injection-locked frequency dividing apparatus 100 includes linear mixers 210 and 220, a frequency multiplier 230, an oscillator 240, and output buffers 251 and 252.

In the present embodiment, the oscillator 240 is a cross-coupled VCO (i.e., a negative-resistance oscillator having a differential structure). The oscillator 240 includes inductors L1-L4, variable capacitors VA1 and VA2, and cross-coupled transistors CT1 and CT2. One ends of the inductors L1 and L2 are both coupled to a supply voltage VDD. One ends of the variable capacitors VA1 and VA2 are respectively coupled to another ends of the inductors L1 and L2, and another ends of the variable capacitors VA1 and VA2 are coupled to each other and both receive an adjustment voltage VTUNE. One ends of the inductors L3 and L4 are respectively coupled to one ends of the variable capacitors VA1 and VA2, and another ends of the inductors L3 and L4 are respectively coupled to the gates of mixing transistors MT1 and MT2. The gate of the cross-coupled transistor CT1 is coupled to another end of the inductor L4, the first source/drain of the cross-coupled transistor CT1 is coupled to one end of the inductor L3, and the second source/drain of the cross-coupled transistor CT1 is coupled to the frequency multiplier 130 for supplying one frequency signal. The gate of the cross-coupled transistor CT2 is coupled to another end of the inductor L3, the first source/drain of the cross-coupled transistor CT2 is coupled to one end of the inductor L4, and the second source/drain of the cross-coupled transistor CT2 is coupled to the frequency multiplier 130 for supplying another frequency signal.

It should be noted that because there is a parasitic resistor in the inductive-capacitive resonance cavity constituted by the inductors L3 and L4 and the variable capacitors VA1 and VA2 and the parasitic resistor continuously consumes the power of the frequency signal generated therein, a power has to be supplied to the oscillator 140 by an active circuit. The equivalent resistance provided by the cross-coupled transistors CT1 and CT2 is a negative value. Thus, the frequency signal can be kept stable and prevented from attenuating from internal resistance by connecting the cross-coupled transistors CT1 and CT2 with foregoing inductive-capacitive resonance cavity in parallel. The oscillator 140 can change the oscillation frequency of the frequency signal by adjusting the adjustment voltage VTUNE connected to the variable capacitors VA1 and VA2, and because the lock range has to be around three times of the oscillation frequency of the frequency signal, the lock range is also extended due to the adjustment of the adjustment voltage VTUNE. In the present embodiment, the amplitudes of signals on the gates of the cross-coupled transistors CT1 and CT2 are increased by connecting the inductors L3 and L4 to the cross-coupled route in series, so that the power consumption of the injection-locked frequency dividing apparatus 100 can be reduced.

The frequency multiplier 230 includes a multiple frequency inductor ML1. The multiple frequency inductor ML1 is coupled between the second source/drains of the cross-coupled transistors CT1 and CT2 and the ground voltage GND. The frequency multiplier 230 receives the frequency signal and generates the multiple-frequency signal according to the frequency signal, wherein the frequency of the multiple-frequency signal is twice the frequency of the frequency signal. The frequency multiplier 230 has a push-push frequency multiplication structure based on the differential feature of the oscillator 140 and the symmetry of the circuit layout. There are two differential-mode oscillation signals $f_o$+ and $f_o$− at the sources of the cross-coupled transistors CT1 and CT2 in the oscillator 140, wherein the baseband signals are in the odd mode therefore cancel each other out, and the double-frequency signals are in the even mode therefore add up to each other (2$f_o$). The multiple frequency inductor ML1 at the end allows, as the load of the multiple-frequency signal, the multiple-frequency signal to be sent back to the linear mixers 210 and 220.

The linear mixers 210 and 220 are respectively composed of mixing transistors MT1 and MT2. The gate of the mixing transistor MT1 receives the input signal IN1, the first source/drain of the mixing transistor MT1 is coupled to the supply voltage VDD, and the second source/drain of the mixing transistor MT1 is coupled to the frequency multiplier 130 for receiving the multiple-frequency signal and mixing the multiple-frequency signal with the input signal IN1 to generate the mixed signal MI1 at the second source/drain of the mixing transistor MT1. Similarly, the gate of the mixing transistor MT2 receives the input signal IN2, the first source/drain of the mixing transistor MT2 is coupled to the supply voltage VDD, and the second source/drain of the mixing transistor MT2 is coupled to the frequency multiplier 130 for receiving the multiple-frequency signal and mixing the multiple-frequency signal with the input signal IN2 to generate the mixed signal MI2 at the second source/drain of the mixing transistor MT2.

The output buffer 151 includes an output transistor BT1, an output inductor BL1, and an output capacitor BC1. The gate of the output transistor BT1 is coupled to a common end of the inductors L1 and L3 and the cross-coupled transistor CT1, and the second source/drain of the output transistors BT1 is coupled to the multiple frequency inductor ML1. The output inductor BL1 is connected between the supply voltage VDD and the first source/drain of the output transistor BT1 in series. One end of the output capacitor BC1 is coupled to the first source/drain of the output transistor BT1, and the other end thereof generates the buffered output signal BOU1.

The output buffer 152 includes an output transistor BT2, an output inductors BL2, and an output capacitor BC2. The gate of the output transistor BT2 is coupled to a common end of the inductors L2 and L4 and the cross-coupled transistors CT2, and the second source/drain of the output transistor BT2 is coupled to a multiple frequency inductor ML2. The output inductor BL2 is connected between the supply voltage VDD and the first source/drain of the output transistor BT2 in series. One end of the output capacitor BC2 is coupled to the first source/drain of the output transistor BT2, and the other end thereof generates the buffered output signal BOU2. In the implementation described above, only one layer of transistors is disposed to achieve a low-voltage operation characteristic and reduce the power consumption. Meanwhile, by increasing the gate amplitude, a large harmonic factor can be produced in the push-push structure so that a strong multiple-frequency signal can be generated and the lock range can be extended. The mixing transistors MT1 and MT2 are spanned between the gates of the cross-coupled transistors CT1 and CT2 and the supply voltage VDD. The input signals IN1 and IN2 are respectively input to the gates of the mixing transistors MT1 and MT2. The gates of the mixing transistors MT1 and MT2 receive an appropriate DC bias voltage VBIAS through the inductors L5 and L6. In addition, a multiple-frequency signal is generated on a common node of the cross-coupled transistors CT1 and CT2 and the multiple frequency inductor ML1 and is sent to the first source/drains of the cross-coupled transistors CT1 and CT2 through the coupling path generated through the parasitic effect of the cross-coupled transistors CT1 and CT2 and supplied to the linear mixers 210 and 220 to be mixed.

Figure 3:
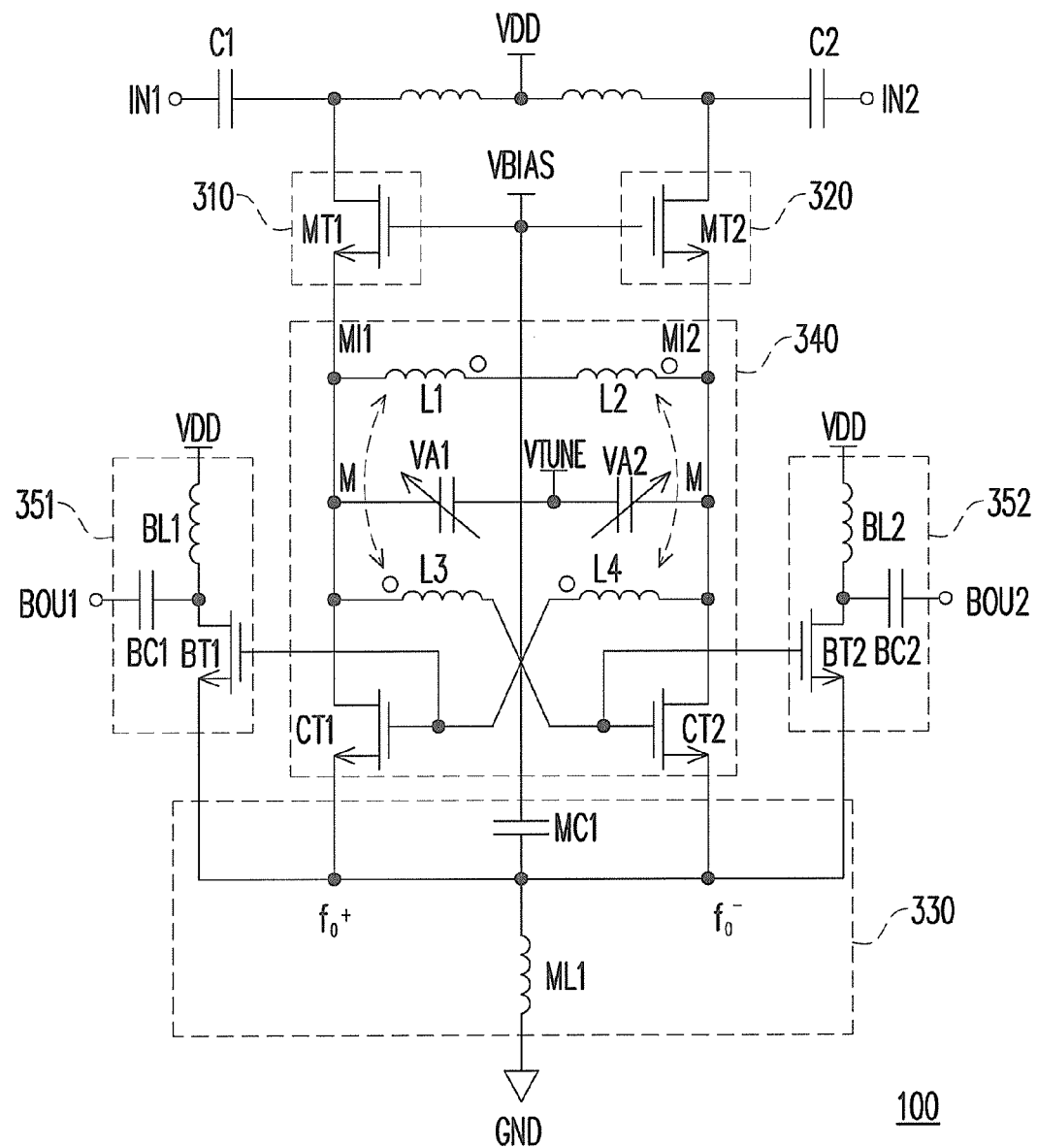

FIG. 3 illustrates an implementation of the injection-locked frequency dividing apparatus 100 according to another embodiment of the present invention. In the present embodiment, the injection-locked frequency dividing apparatus 100 includes linear mixers 310 and 320, a frequency multiplier 330, an oscillator 340, and output buffers 351 and 352.

The linear mixers 310 and 320 are respectively composed of the mixing transistors MT1 and MT2. The gate of the mixing transistor 310 receives the bias voltage VBIAS and is coupled to the frequency multiplier 330 for receiving the multiple-frequency signal, and the first source/drain of the mixing transistor 310 receives the input signal IN1 through a coupling capacitor C1. Besides, the mixing transistor MT1 mixes the multiple-frequency signal with the input signal IN1 to generate the mixed signal MI1 at the second source/drain thereof. The gate of the mixing transistor 320 also receives the bias voltage VBIAS and is coupled to the frequency multiplier 330 for receiving the multiple-frequency signal, and the first source/drain of the mixing transistor 320 receives the input signal IN2 through the coupling capacitor C2. In addition, the mixing transistor MT2 mixes the multiple-frequency signal with the input signal IN2 to generate the mixed signal MI2 at the second source/drain thereof.

The oscillator 340 includes inductors L1-L4, variable capacitors VA1 and VA, and cross-coupled transistors CT1 and CT2. The inductors L1 and L2 are connected between the second source/drains of the mixing transistors MT1 and MT2 in series, the variable capacitors VA1 and VA are connected between the second source/drains of the mixing transistors MT1 and MT2 in series, and the variable capacitors VA1 and VA2 both receive the adjustment voltage VTUNE. One ends of the inductors L3 and L4 are respectively coupled to one ends of the variable capacitors VA1 and VA2, and another ends of the inductors L3 and L4 are respectively coupled to the gates of the mixing transistors MT1 and MT2.

It should be noted that two transformers having their transformation rate as M are constituted by the inductors L1 and L3 and the inductors L2 and L4. These two transformers are used for increasing the amplitudes of the signals on the gates of the cross-coupled transistors CT1 and CT2 and reducing the surface area taken by the circuit.

The frequency multiplier 330 includes a multiple frequency capacitor MC1 and the multiple frequency inductor ML1. One end of the multiple frequency capacitor MC1 receives a bias voltage VBIAS, and the other end of the multiple frequency capacitor MC1 is coupled to the second source/drains of the cross-coupled transistors CT1 and CT2. The multiple frequency inductor ML1 is connected between the ground voltage GND and the other end of the multiple frequency capacitor MCI in series for receiving the frequency signal and generating the multiple-frequency signal according to the frequency signal, wherein the frequency of the multiple-frequency signal is twice the frequency of the frequency signal.

Similar to those in foregoing embodiment, the output buffers 351 and 352 also include output transistors BT1 and BT2, output capacitors BC1 and BC2, and output inductors BL1 and BL2. However, in the present embodiment, the gates of the output transistors BT1 and BT2 are respectively coupled to the gates of the cross-coupled transistors CT1 and CT2.

FIG. 3 illustrates an implementation of the injection-locked frequency dividing apparatus 100 according to yet another embodiment of the present invention. In the present embodiment, the injection-locked frequency dividing apparatus 100 includes linear mixers 410 and 420, a frequency multiplier 430, an oscillator 440, and output buffers 451 and 452.

The linear mixers 410 and 420 are respectively composed of the mixing transistors MT1 and MT2. The gate of the mixing transistor MT1 receives the input signal IN1 through the coupling capacitor C1, the first source/drain of the mixing transistor MT1 is coupled to the frequency multiplier 430 for receiving the multiple-frequency signal and mixing the multiple-frequency signal with the input signal IN1 to generate the mixed signal MI1 at the second source/drain of the mixing transistor MT1, and the second source/drain of the mixing transistor MT1 is coupled to the oscillator 440. The gate of the mixing transistor MT2 receives the input signal IN2 through the coupling capacitor C2, the first source/drain of the mixing transistor MT2 is coupled to the frequency multiplier 430 for receiving the multiple-frequency signal and mixing the multiple-frequency signal with the input signal IN2 to generate the mixed signal MI2 at the second source/drain of the mixing transistor MT2, and the second source/drain of the mixing transistor MT2 is coupled to the oscillator 440.

The oscillator 440 includes inductors L1-L4, variable capacitors VA1 and VA2, and cross-coupled transistors CT1 and CT2. The couplings between the inductors L3-L4, the variable capacitors VA1 and VA2, and the cross-coupled transistors CT1 and CT2 are the same as those in foregoing embodiment therefore will not be described herein. One ends of the inductors L1 and L2 are both coupled to the supply voltage VDD, the other end of the inductor L1 is coupled to the first source/drain of the cross-coupled transistors CT1, and the other end of the inductor L2 is coupled to the first source/drain of the cross-coupled transistors CT2.

The frequency multiplier 430 includes a multiple frequency inductor ML1. The multiple frequency inductor ML1 is connected between the supply voltage VDD and the first source/drains of the mixing transistors MT1 and MT2 in series.

The output buffers 451 and 452 include output transistors BT1 and BT2, output capacitors BC1 and BC2, and output inductors BL1 and BL2. The output buffers 451 and 452 have a circuit structure same as that illustrated in FIG. 2 therefore will not be described herein.

Regarding the overall operation, the oscillator 440 is a cross-coupled VCO. The mixing transistors MT1 and MT2 are served as linear mixers and provide a transmission path of the frequency signal so that a multiple-frequency signal with a double oscillation frequency can be generated by the frequency multiplier 330. The inductor ML1 is served as the load of the multiple-frequency signal. The multiple-frequency signal is input to the first source/drains of the cross-coupled transistors CT1 and CT2. The input signals IN1 and IN2 are input to the gates of the mixing transistors MT1 and MT2 through the coupling capacitors C1 and C2. The frequency of the mixed signals MI1 and MI2 is equal to the frequency $f_i$ of the input signal minus twice the frequency $2f_o$ of the frequency signal. In the injection-locked situation, the frequency of the mixed signals MI1 and MI2 is equal to the frequency $f_o$ of the frequency signal. Thereby, the divide-by-3 frequency division function is achieved.

FIG. 3 illustrates an implementation of the injection-locked frequency dividing apparatus 100 according to still another embodiment of the present invention. In the present embodiment, the injection-locked frequency dividing apparatus 100 includes linear mixers 510 and 520, a frequency multiplier 530, an oscillator 540, and output buffers 551 and 552.

The linear mixers 510 and 520 are respectively composed of the mixing transistors MT1 and MT2. The gate of the mixing transistor MT1 is coupled to the frequency multiplier 530 for receiving the multiple-frequency signal and mixing the multiple-frequency signal with the input signal IN1 to generate the mixed signal MI1 at the second source/drain of the mixing transistor MT1, and the second source/drain of the mixing transistor MT1 is coupled to the oscillator 540. The gate of the mixing transistor MT2 is coupled to the frequency multiplier 530 for receiving the multiple-frequency signal and mixing the multiple-frequency signal with the input signal IN2 to generate the mixed signal MI2 at the second source/drain of the mixing transistor MT2, and the second source/drain of the mixing transistor MT2 is coupled to the oscillator 540.

The oscillator 540 includes inductors L1-L4, variable capacitors VA1 and VA2, and cross-coupled transistors CT1 and CT2. One ends of the inductors L1 and L2 are coupled to the supply voltage VDD, and the other ends thereof are respectively coupled to the first source/drains of the mixing transistors MT1 and MT2. The variable capacitors VA1 and VA2 are connected between the second source/drains of the mixing transistors MT1 and MT2 in series and both receive the adjustment voltage VTUNE. The second source/drain of the cross-coupled transistors CT1 is coupled to the ground voltage GND. The gate of the cross-coupled transistors CT2 is coupled to the first source/drain of the cross-coupled transistors CT1, the first source/drain of the cross-coupled transistors CT2 is coupled to the gate of the cross-coupled transistors CT1, and the second source/drain of the cross-coupled transistors CT2 is coupled to the ground voltage GND.

The frequency multiplier 530 includes multiple frequency inductors ML1-ML3. One end of the multiple frequency inductor ML1 is coupled to the bias voltage VBIAS. One end of the multiple frequency inductor ML2 is coupled to the gate of the mixing transistor MT1, and the other end thereof is coupled to the other end of the multiple frequency inductor ML1. One end of the multiple frequency inductor ML3 is coupled to the gate of the mixing transistor MT2, and the other end thereof is coupled to both the multiple frequency inductors ML1 and ML2.

Figure 4:
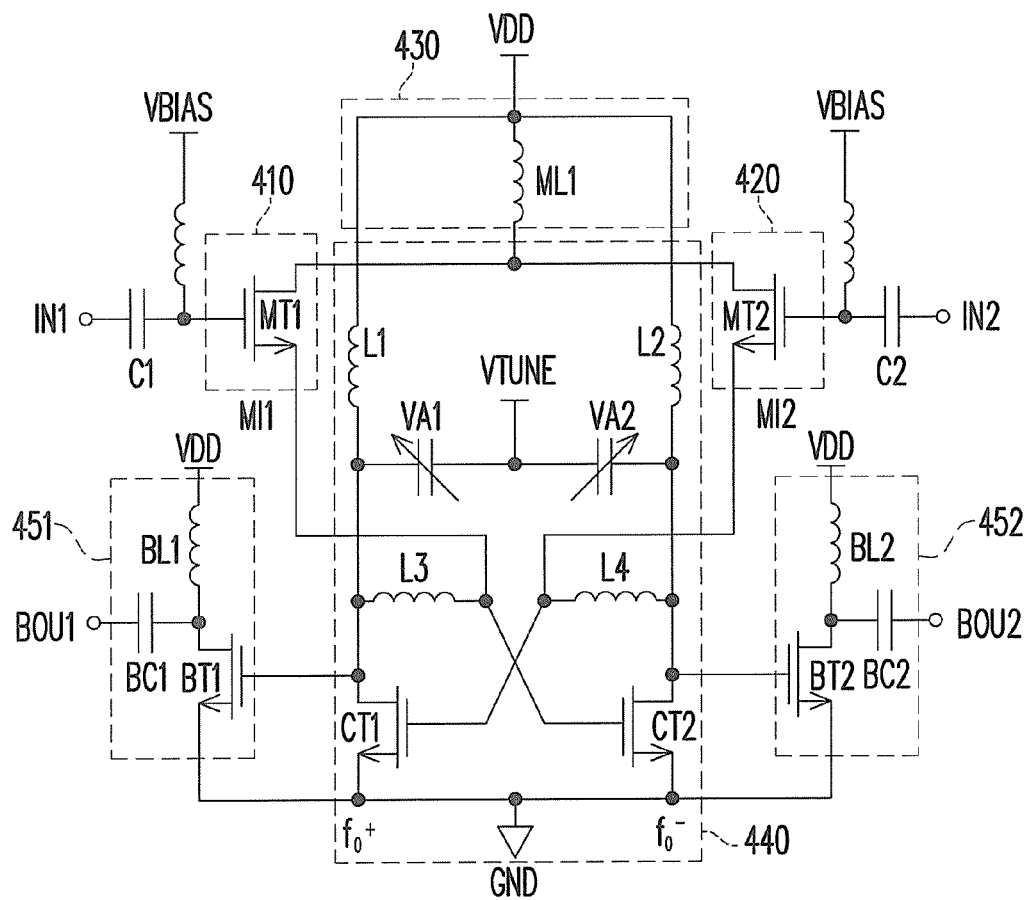
Figure 5:
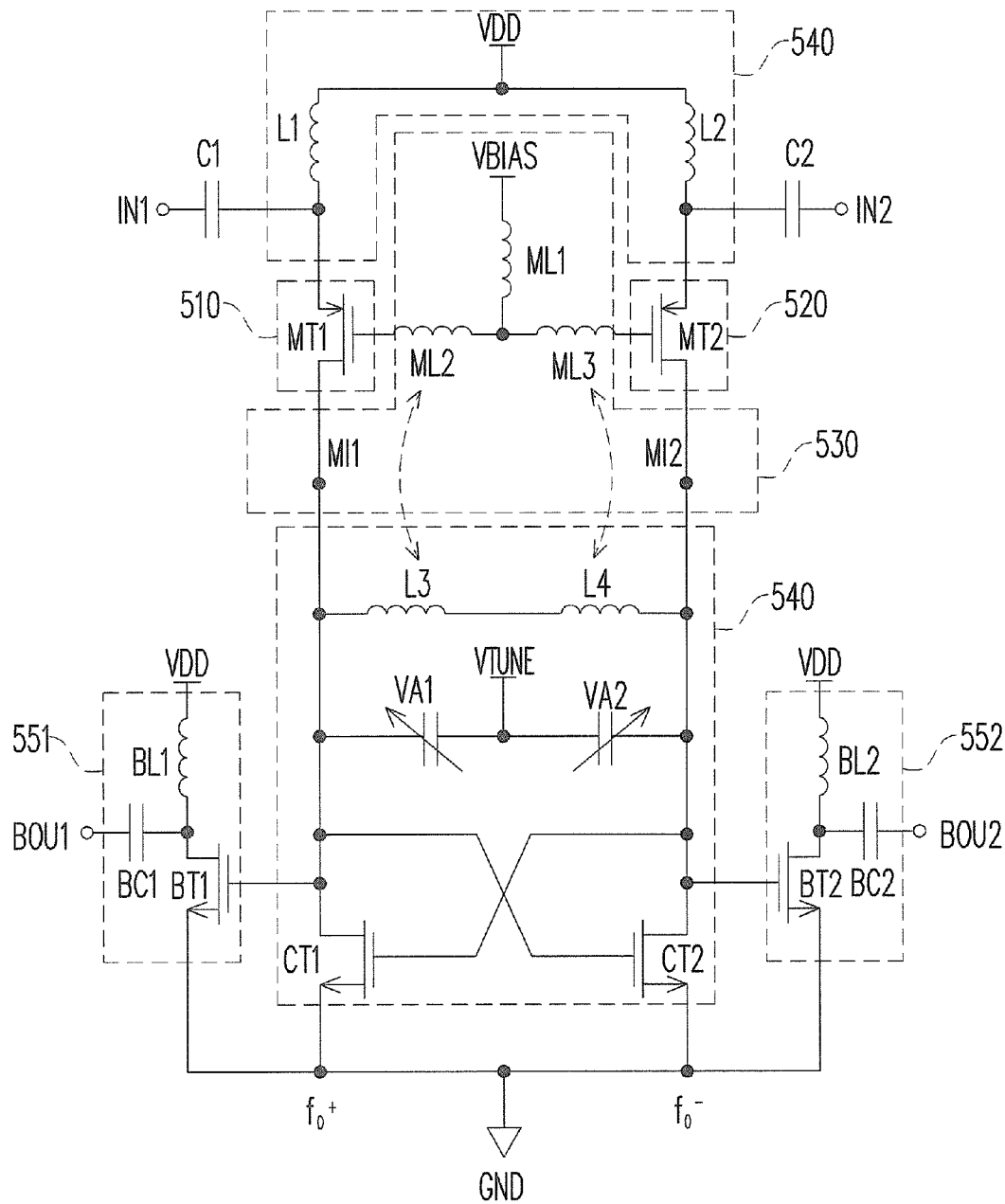

The output buffers 551 and 552 include output transistors BT1 and BT2, output capacitors BC1 and BC2, and output inductors BL1 and BL2. The output buffers 551 and 552 have a circuit structure same as that illustrated in FIG. 4 therefore will not be described herein.

Regarding the overall operation, in the present embodiment, the mixing transistors MT1 and MT2 are implemented with p-type CMOS transistors. The first source/drains of the mixing transistors MT1 and MT2 respectively receive the input signals IN1 and IN2 having a frequency and the gate of the mixing transistors MT1 and MT2 receive the multiple-frequency signal which has a frequency $2f_o$ and is generated by the frequency multiplier 530 and a frequency signal which has a frequency $f_o$ and is coupled by a transformer. The oscillator 540 is disposed in the resonance cavity formed by the inductors L3 and L4 and the variable capacitors VA1 and VA2, wherein the multiple frequency inductor ML2 and the inductor L3 constitute a transformer, and the multiple frequency inductor ML3 and the inductor L4 also constitute a transformer. The frequency signal can be used for nonlinear mixing through the coupling of foregoing transformer. Meanwhile, the multiple-frequency signal having a double frequency $2f_o$ is generated at the common node of the multiple frequency inductors ML1-ML3 and is sent to the linear mixers 510 and 520 for linear mixing. The existence of the linear mixers 510 and 520 extends the lock range. The inductors L1 and L2 are served as the loads of the input signals IN1 and IN2. The mixing results of the linear mixers 510 and 520 are output from the second source/drains of the mixing transistors MT1 and MT2 so as to lock the oscillator 540.

In summary, in the present invention, linear mixers are disposed to eliminate the harmonic factors generated by a nonlinear circuit. Besides, the frequency lock range of the injection-locked frequency dividing apparatus is effectively extended through the amplitude increasing function of the inductors in the oscillator.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An injection-locked frequency dividing apparatus, comprising:
a frequency multiplier, for receiving a frequency signal and generating a multiple-frequency signal according to the frequency signal;
a first linear mixer and a second linear mixer, both coupled to the frequency multiplier for receiving the multiple-frequency signal, the first and the second linear mixer respectively receives a first input signal and a second input signal and mixes the multiple-frequency signal with the first input signal and the second input signal to generate a first mixed signal and a second mixed signal respectively, wherein a phase of the first input signal is complementary to a phase of the second input signal, wherein the first linear mixer comprises:
a first mixing transistor, having a gate for receiving the first input signal, a first source/drain coupled to a supply voltage, and a second source/drain coupled to the frequency multiplier for receiving the multiple-frequency signal and mixing the multiple-frequency signal with the first input signal to generate the first mixed signal at the second source/drain of the first mixing transistor;
the second linear mixer comprises:
a second mixing transistor, having a gate for receiving the second input signal, a first source/drain coupled to the supply voltage, and a second source/drain coupled to the frequency multiplier for receiving the multiple-frequency signal and mixing the multiple-frequency signal with the second input signal to generate the second mixed signal at the second source/drain of the second mixing transistor;
an oscillator, coupled to the first linear mixer, the second linear mixer, and the frequency multiplier, for generating the frequency signal, and the oscillator further receives the first mixed signal and the second mixed signal for generating a first output signal and a second output signal according to the first mixed signal and the second mixed signal, wherein a phase of the first output signal is complementary to a phase of the second output signal;
a first output buffer, coupled to the oscillator for receiving the first output signal; and
a second output buffer, coupled to the oscillator for receiving the second output signal,
wherein the first output buffer and the second output buffer respectively generate a first buffered output signal and a second buffered output signal according to the first output signal and the second output signal.

2. The injection-locked frequency dividing apparatus according to claim 1, wherein the oscillator is a cross-coupled voltage-controlled oscillator (VCO).

3. The injection-locked frequency dividing apparatus according to claim 1, wherein the oscillator comprises:
a first inductor and a second inductor, wherein one end of the first inductor and one end of the second inductor are both coupled to the supply voltage;
a first variable capacitor and a second variable capacitor, wherein one end of the first variable capacitor and one end of the second variable capacitor are respectively coupled to another end of the first inductor and another end of the second inductor, and another end of the first variable capacitor and another end of the second variable capacitor are coupled to each other and both receive an adjustment voltage;
a third inductor and a fourth inductor, wherein one end of the third inductor and one end of the fourth inductor are respectively coupled to one end of the first variable capacitor and one end of the second variable capacitor;
a first cross-coupled transistor, having a gate coupled to another end of the fourth inductor, a first source/drain coupled to one end of the third inductor, and a second source/drain coupled to the frequency multiplier for supplying one of the frequency signal; and
a second cross-coupled transistor, having a gate coupled to another end of the third inductor, a first source/drain coupled to one end of the fourth inductor, and a second source/drain coupled to the frequency multiplier for supplying another one of the frequency signal.

4. The injection-locked frequency dividing apparatus according to claim 3, wherein the frequency multiplier comprises:
a multiple frequency inductor, coupled between the second source/drains of the first cross-coupled transistor and the second cross-coupled transistor and a ground voltage, for receiving the frequency signal and generating the multiple-frequency signal according to the frequency signal, wherein a frequency of the multiple-frequency signal is twice a frequency of the frequency signal.

5. The injection-locked frequency dividing apparatus according to claim 4, wherein,
the first output buffer comprises:
a first output transistor, having a gate coupled to a common end of the first inductor, the third inductor, and the first cross-coupled transistor, a first source/drain, and a second source/drain coupled to the multiple frequency inductor;
a first output inductor, having one end coupled to the supply voltage and another end coupled to the first source/drain of the first output transistor; and
a first output capacitor, having one end coupled to the first source/drain of the first output transistor and another end for generating the first buffered output signal;
the second output buffer comprises:
a second output transistor, having a gate coupled to a common end of the second inductor, the fourth inductor, and the second cross-coupled transistor, a first source/drain, and a second source/drain coupled to the multiple frequency inductor;
a second output inductor, having one end coupled to the supply voltage and another end coupled to the first source/drain of the second output transistor; and
a second output capacitor, having one end coupled to the first source/drain of the second output transistor and another end for generating the second buffered output signal.

6. An injection-locked frequency dividing apparatus, comprising:
a frequency multiplier, for receiving a frequency signal and generating a multiple-frequency signal according to the frequency signal;
a first linear mixer and a second linear mixer, both coupled to the frequency multiplier for receiving the multiple-frequency signal, the first and the second linear mixer respectively receives a first input signal and a second input signal and mixes the multiple-frequency signal with the first input signal and the second input signal to generate a first mixed signal and a second mixed signal respectively, wherein a phase of the first input signal is complementary to a phase of the second input signal, wherein, the first linear mixer comprises:

a first mixing transistor, having a gate for receiving a bias voltage and coupled to the frequency multiplier for receiving the multiple-frequency signal, a first source/drain for receiving the first input signal, and a second source/drain, wherein the first mixing transistor mixes the multiple-frequency signal with the first input signal to generate the first mixed signal at the second source/drain of the first mixing transistor;

the second linear mixer comprises:

a second mixing transistor, having a gate for receiving the bias voltage and coupled to the frequency multiplier for receiving the multiple-frequency signal, a first source/drain for receiving the second input signal, and a second source/drain, wherein the second mixing transistor mixes the multiple-frequency signal with the second input signal to generate the second mixed signal at the second source/drain of the second mixing transistor;

an oscillator, coupled to the first linear mixer, the second linear mixer, and the frequency multiplier, for generating the frequency signal, and the oscillator further receives the first mixed signal and the second mixed signal for generating a first output signal and a second output signal according to the first mixed signal and the second mixed signal, wherein a phase of the first output signal is complementary to a phase of the second output signal;

a first output buffer, coupled to the oscillator for receiving the first output signal; and a second output buffer, coupled to the oscillator for receiving the second output signal, wherein the first output buffer and the second output buffer respectively generate a first buffered output signal and a second buffered output signal according to the first output signal and the second output signal.

7. The injection-locked frequency dividing apparatus according to claim 6, wherein the oscillator comprises:

a first inductor and a second inductor, coupled between the second source/drains of the first mixing transistor and the second mixing transistor in series;

a first variable capacitor and a second variable capacitor, coupled between the second source/drains of the first mixing transistor and the second mixing transistor in series, wherein the first variable capacitor and the second variable capacitor both receive an adjustment voltage;

a third inductor and a fourth inductor, wherein one end of the third inductor and one end of the fourth inductor are respectively coupled to one end of the first variable capacitor and one end of the second variable capacitor;

a first cross-coupled transistor, having a gate coupled to another end of the fourth inductor, a first source/drain coupled to one end of the third inductor, and a second source/drain coupled to the frequency multiplier for supplying one of the frequency signal; and a second cross-coupled transistor, having a gate coupled to another end of the third inductor, a first source/drain coupled to one end of the fourth inductor, and a second source/drain coupled to the frequency multiplier for supplying another one of the frequency signal.

8. The injection-locked frequency dividing apparatus according to claim 7, wherein the frequency multiplier comprises:

a multiple frequency capacitor, having one end for receiving the bias voltage and another end coupled to the second source/drains of the first cross-coupled transistor and the second cross-coupled transistor; and a multiple frequency inductor, connected between a ground voltage and another end of the multiple frequency capacitor in series, for receiving the frequency signal and generating the multiple-frequency signal according to the frequency signal, wherein a frequency of the multiple-frequency signal is twice a frequency of the frequency signal.

9. The injection-locked frequency dividing apparatus according to claim 8, wherein, the first output buffer comprises:

a first output transistor, having a gate coupled to the gate of the first cross-coupled transistor, a first source/drain, and a second source/drain coupled to the multiple frequency inductor;

a first output inductor, having one end coupled to the supply voltage and another end coupled to the first source/drain of the first output transistor; and a first output capacitor, having one end coupled to the first source/drain of the first output transistor and another end for generating the first buffered output signal;

the second output buffer comprises:

a second output transistor, having a gate coupled to the gate of the second cross-coupled transistor, a first source/drain, and a second source/drain coupled to the multiple frequency inductor;

a second output inductor, having one end coupled to the supply voltage and another end coupled to the first source/drain of the second output transistor; and a second output capacitor, having one end coupled to the first source/drain of the second output transistor and another end for generating the second buffered output signal.

10. An injection-locked frequency dividing apparatus, comprising:

a frequency multiplier, for receiving a frequency signal and generating a multiple-frequency signal according to the frequency signal;

a first linear mixer and a second linear mixer, both coupled to the frequency multiplier for receiving the multiple-frequency signal, the first and the second linear mixer respectively receives a first input signal and a second input signal and mixes the multiple-frequency signal with the first input signal and the second input signal to generate a first mixed signal and a second mixed signal respectively, wherein a phase of the first input signal is complementary to a phase of the second input signal, wherein, the first linear mixer comprises:

a first mixing transistor, having a first source/drain for receiving the first input signal, a gate coupled to the frequency multiplier for receiving the multiple-frequency signal and mixing the multiple-frequency signal with the first input signal to generate the first mixed signal at a second source/drain of the first mixing transistor, and the second source/drain coupled to the oscillator;

the second linear mixer comprises:

a second mixing transistor, having a first source/drain for receiving the second input signal, a gate coupled to the frequency multiplier for receiving the multiple-frequency signal and mixing the multiple-frequency signal with the second input signal to generate the second mixed signal at a second source/drain of the second mixing transistor, and the second source/drain coupled to the oscillator;
an oscillator, coupled to the first linear mixer, the second linear mixer, and the frequency multiplier, for generating the frequency signal, and the oscillator further receives the first mixed signal and the second mixed signal for generating a first output signal and a second output signal according to the first mixed signal and the second mixed signal, wherein a phase of the first output signal is complementary to a phase of the second output signal;
a first output buffer, coupled to the oscillator for receiving the first output signal; and
a second output buffer, coupled to the oscillator for receiving the second output signal,
wherein the first output buffer and the second output buffer respectively generate a first buffered output signal and a second buffered output signal according to the first output signal and the second output signal.

11. The injection-locked frequency dividing apparatus according to claim 10, wherein the oscillator comprises:
a first inductor and a second inductor, wherein one end of the first inductor and one end of the second inductor are coupled to a supply voltage;
a first variable capacitor and a second variable capacitor, connected between another end of the first inductor and another end of the second inductor in series, wherein the first variable capacitor and the second variable capacitor both receive an adjustment voltage;
a third inductor and a fourth inductor, wherein one end of the third inductor and one end of the fourth inductor are respectively coupled to one end of the first variable capacitor and one end of the second variable capacitor;
a first cross-coupled transistor, having a gate coupled to another end of the fourth inductor, a first source/drain coupled to one end of the third inductor, and a second source/drain coupled to a ground voltage; and
a second cross-coupled transistor, having a gate coupled to another end of the third inductor, a first source/drain coupled to one end of the fourth inductor, and a second source/drain coupled to the ground voltage.

12. The injection-locked frequency dividing apparatus according to claim 11, wherein the frequency multiplier comprises:
a multiple frequency inductor, connected between the supply voltage and the first source/drains of the first mixing transistor and the second mixing transistor in series, for receiving the frequency signal and generating the multiple-frequency signal according to the frequency signal, wherein a frequency of the multiple-frequency signal is twice a frequency of the frequency signal.

13. The injection-locked frequency dividing apparatus according to claim 12, wherein,
the first output buffer comprises:
a first output transistor, having a gate coupled to the first source/drain of the first cross-coupled transistor, a first source/drain, and a second source/drain coupled to the ground voltage;
a first output inductor, having one end coupled to the supply voltage and another end coupled to the first source/drain of the first output transistor; and
a first output capacitor, having one end coupled to the first source/drain of the first output transistor and another end for generating the first buffered output signal;
the second output buffer comprises:
a second output transistor, having a gate coupled to the first source/drain of the second cross-coupled transistor, a first source/drain, and a second source/drain coupled to the ground voltage;
a second output inductor, having one end coupled to the supply voltage and another end coupled to the first source/drain of the second output transistor; and
a second output capacitor, having one end coupled to the first source/drain of the second output transistor and another end for generating the second buffered output signal.

14. An injection-locked frequency dividing apparatus, comprising:
a frequency multiplier, for receiving a frequency signal and generating a multiple-frequency signal according to the frequency signal;
a first linear mixer and a second linear mixer, both coupled to the frequency multiplier for receiving the multiple-frequency signal, the first and the second linear mixer respectively receives a first input signal and a second input signal and mixes the multiple-frequency signal with the first input signal and the second input signal to generate a first mixed signal and a second mixed signal respectively, wherein a phase of the first input signal is complementary to a phase of the second input signal,
wherein, the first linear mixer comprises:
a first mixing transistor, having a first source/drain for receiving the first input signal, a gate coupled to the frequency multiplier for receiving the multiple-frequency signal and mixing the multiple-frequency signal with the first input signal to generate the first mixed signal at a second source/drain of the first mixing transistor, and the second source/drain coupled to the oscillator;
the second linear mixer comprises:
a second mixing transistor, having a first source/drain for receiving the second input signal, a gate coupled to the frequency multiplier for receiving the multiple-frequency signal and mixing the multiple-frequency signal with the second input signal to generate the second mixed signal at a second source/drain of the second mixing transistor, and the second source/drain coupled to the oscillator;
an oscillator, coupled to the first linear mixer, the second linear mixer, and the frequency multiplier, for generating the frequency signal, and the oscillator further receives the first mixed signal and the second mixed signal for generating a first output signal and a second output signal according to the first mixed signal and the second mixed signal, wherein a phase of the first output signal is complementary to a phase of the second output signal;
a first output buffer, coupled to the oscillator for receiving the first output signal; and
a second output buffer, coupled to the oscillator for receiving the second output signal,
wherein the first output buffer and the second output buffer respectively generate a first buffered output signal and a second buffered output signal according to the first output signal and the second output signal.

15. The injection-locked frequency dividing apparatus according to claim 14, wherein the oscillator comprises:
a first inductor and a second inductor, wherein one end of the first inductor and one end of the second inductor are coupled to a supply voltage, and another end of the first inductor and another end of the second inductor are respectively coupled to the first source/drains of the first mixing transistor and the second mixing transistor;

a first variable capacitor and a second variable capacitor, connected between the second source/drains of the first mixing transistor and the second mixing transistor in series, wherein the first variable capacitor and the second variable capacitor both receive an adjustment voltage;

a third inductor and a fourth inductor, connected between the second source/drains of the first mixing transistor and the second mixing transistor in series;

a first cross-coupled transistor, having a gate, a first source/drain, and a second source/drain coupled to a ground voltage; and a second cross-coupled transistor, having a gate coupled to the first source/drain of the first cross-coupled transistor, a first source/drain coupled to the gate of the first cross-coupled transistor, and a second source/drain coupled to the ground voltage.

16. The injection-locked frequency dividing apparatus according to claim 15, wherein the frequency multiplier comprises:

a first multiple frequency inductor, having one end coupled to a bias voltage;

a second multiple frequency inductor, having one end coupled to the gate of the first mixing transistor and another end coupled to another end of the first multiple frequency inductor; and a third multiple frequency inductor, having one end coupled to the gate of the second mixing transistor and another end coupled to both the first multiple frequency inductor and the second multiple frequency inductor.

17. The injection-locked frequency dividing apparatus according to claim 16, wherein, the first output buffer comprises:

a first output transistor, having a gate coupled to the first source/drain of the first cross-coupled transistor, a first source/drain, and a second source/drain coupled to the ground voltage;

a first output inductor, having one end coupled to the supply voltage and another end coupled to the first source/drain of the first output transistor; and a first output capacitor, having one end coupled to the first source/drain of the first output transistor and another end for generating the first buffered output signal;

the second output buffer comprises:

a second output transistor, having a gate coupled to the first source/drain of the second cross-coupled transistor, a first source/drain, and a second source/drain coupled to the ground voltage;

a second output inductor, having one end coupled to the supply voltage and another end coupled to the first source/drain of the second output transistor; and a second output capacitor, having one end coupled to the first source/drain of the second output transistor and another end for generating the second buffered output signal.

* * * * *